(12) United States Patent
Kikuchi et al.

(10) Patent No.: US 7,737,523 B2
(45) Date of Patent: Jun. 15, 2010

(54) SEMICONDUCTOR DEVICE

(75) Inventors: Shuichi Kikuchi, Gunma (JP); Shigeaki Okawa, Tochigi (JP); Kiyofumi Nakaya, Saitama (JP); Toshiyuki Takahashi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 31 days.

(21) Appl. No.: 11/395,599

(22) Filed: Mar. 30, 2006

(65) Prior Publication Data

US 2006/0220166 A1 Oct. 5, 2006

(30) Foreign Application Priority Data

Mar. 30, 2005 (JP) ............................. P2005-098965
Mar. 9, 2006 (JP) ............................. P2006-064619

(51) Int. Cl.
*H01L 29/93* (2006.01)
(52) U.S. Cl. ................. 257/484; 257/E27.04
(58) Field of Classification Search ................. 257/484, 257/E27.04
See application file for complete search history.

(56) References Cited

U.S. PATENT DOCUMENTS

| 4,027,325 A | | 5/1977 | Genesi |
| 4,451,839 A | | 5/1984 | Nelson |
| 4,613,887 A | * | 9/1986 | Fukuda et al. ............... 257/273 |
| 5,101,244 A | | 3/1992 | Mori et al. |
| 5,468,984 A | * | 11/1995 | Efland et al. ................. 257/356 |
| 5,545,909 A | * | 8/1996 | Williams et al. ............. 257/355 |
| 5,552,625 A | | 9/1996 | Murakami et al. |
| 5,770,886 A | * | 6/1998 | Rao et al. .................... 257/533 |
| 5,982,015 A | | 11/1999 | Hirayama et al. |
| 6,060,752 A | | 5/2000 | Williams |
| 6,207,484 B1 | * | 3/2001 | Kim et al. .................... 438/209 |
| 6,693,327 B2 | | 2/2004 | Priefert et al. |

(Continued)

FOREIGN PATENT DOCUMENTS

EP 0450306 A1 10/1991

(Continued)

OTHER PUBLICATIONS

Office action, mailed May 25, 2007 in copending U.S. Appl. No. 11/395,890.

(Continued)

*Primary Examiner*—Bradley K Smith
*Assistant Examiner*—Amar Movva
(74) *Attorney, Agent, or Firm*—Fish & Richardson P.C.

(57) ABSTRACT

In a semiconductor device of the present invention, a protection diode for protecting a device is formed on an epitaxial layer formed on a substrate. A Schottky barrier metal layer is formed on a surface of the epitaxial layer and a P-type diffusion layer is formed at a lower portion of an end portion of the Schottky barrier metal layer. Then, a P-type diffusion layer is formed to be connected to a P-type diffusion layer and is extended to a cathode region. A metal layer to which an anode electrode is applied is formed above the P-type diffusion layer, thereby making it possible to obtain a field plate effect. This structure reduces a large change in a curvature of a depletion layer, thereby improving a withstand voltage characteristic of the protection diode.

7 Claims, 7 Drawing Sheets

U.S. PATENT DOCUMENTS

| | | |
|---|---|---|
| 2002/0079554 A1 | 6/2002 | Okawa et al. |
| 2002/0190338 A1* | 12/2002 | Skocki ........................ 257/471 |
| 2003/0060031 A1 | 3/2003 | Asano et al. |
| 2005/0280114 A1 | 12/2005 | Singh |
| 2006/0220166 A1 | 10/2006 | Kikuchi et al. |
| 2006/0244050 A1 | 11/2006 | Sudou |
| 2006/0244091 A1 | 11/2006 | Kikuchi et al. |
| 2008/0079110 A1 | 4/2008 | Kikuchi et al. |
| 2008/0164556 A1 | 7/2008 | Kikuchi et al. |

FOREIGN PATENT DOCUMENTS

| | | |
|---|---|---|
| JP | 08-107222 | 4/1996 |
| JP | 08-130317 | 5/1996 |
| JP | 09-121062 | 5/1997 |
| JP | 2002-314099 | 10/2002 |
| JP | 2006-186392 | 7/2006 |

OTHER PUBLICATIONS

Office action, mailed Dec. 20, 2007 in copending U.S. Appl. No. 11/395,890.

Office action, mailed May 28, 2008 in copending U.S. Appl. No. 11/395,890.

Office Action mailed Jan. 13, 2009, issued in copending U.S. Appl. No. 11/395,890.

Perez, R., et al., "Analysis of 1.2kV JBS Rectifiers Fabricated in 4H-SiC," Semiconductor Science and Technology, May 5, 2006, pp. 670-676, 21:5, IOP Publishing Ltd., UK.

European Search Report, Oct. 10, 2008.

Chinese Office Action, Mar. 4, 2009.

Korean Office action mailed Jul. 14, 2009.

Office action issued in related U.S. Appl. No. 11/862,585, dated Jul. 9, 2009.

* cited by examiner

SEMICONDUCTOR DEVICE

Priority is claimed to Japanese Patent Application Numbers JP2005-098965, filed on Mar. 30, 2005, and JP2006-064619, filed on Mar. 9, 2006, the disclosures of which are incorporated herein by reference in its entireties.

BACKGROUND OF THE INVENTION

1. Field of the Invention

The present invention relates to a semiconductor device that protects a circuit element from an overvoltage.

2. Description of the Related Art

In a conventional semiconductor device, an N-type epitaxial layer is formed on an N-type semiconductor substrate. A P-type diffusion layer is overlapped onto an N-type diffusion layer formed on the epitaxial layer. Then, an anode electrode is formed on the P-type diffusion layer, and a cathode electrode is formed on a back surface of the substrate to form a Zener diode using a PN junction of both diffusion layers. A P-type guard region is formed around the P-type diffusion layer and another guard region is formed on its outer side. A Schottky barrier metal layer is formed in such a way to come in contact with the epitaxial layer surrounded by both guard regions. Then, a Schottky barrier diode is formed of a silicide of the Schottky barrier metal layer and the epitaxial layer. In the conventional semiconductor device, the Zener diode and the Schottky barrier diode are connected in parallel to achieve a reduction in a forward voltage (Vf) of a device itself. This technology is described for instance in Japanese Patent Application Publication No. Hei 8 (1996)-107222 (Pages 2 to 4, FIG. 1).

In a conventional semiconductor device, P-type diffusion layers with a high impurity concentration are formed on a surface of an N-type semiconductor region and a P-type diffusion layer with a low impurity concentration is formed between the diffusion layers with a high impurity concentration. An electrode formed on the surface of the N-type semiconductor region makes an ohmic contact with the P-type diffusion layer with a high impurity concentration to form a Schottky barrier between the P-type diffusion layer with a high impurity concentration and the P-type diffusion layer with a low impurity concentration. In a forming region where the P-type diffusion layer with a high impurity concentration is formed, a Zener diode is formed using a PN junction. On the other hand, in a forming region where the P-type diffusion layer with a low impurity concentration is formed, a diode, which includes the Zener diode and a Schottky barrier, is formed. This structure decreases free carriers (holes) to be injected into the N-type semiconductor region from the P-type diffusion layer and reduces free carriers (holes) to be stored in the vicinity of the PN junction region. This results in a reduced reverse recovery current density. This technology is described for instance in Japanese Patent Application Publication No. Hei 9 (1997)-121062 (Pages 5-6, FIG. 2).

In a conventional planar type semiconductor device, an anode electrode is formed on a top surface of a P-type semiconductor region formed in an N-type semiconductor region. A conductive field plate, which is connected to the anode electrode, is formed on a top surface of the N-type semiconductor region. Moreover, an equipotential ring electrode and the conductive field plate formed on a top surface of the N-type semiconductor region are connected to each other by a resistive field plate. Then, a thickness of an insulation film which is positioned at a lower portion of a boundary between the conductive field plate and the resistive field plate is thickened, and a thickness of an insulation film, which is positioned at a lower portion of the resistive field plate on the equipotential ring electrode, is thinned. This structure intensifies an effect of the resistive field plate to reduce a curvature of a depletion layer placed at the lower portion of the boundary between the conductive field plate and the resistive field plate. This achieves an improvement in a withstand voltage characteristic in a region where an electric field concentration is apt to occur. This technology is described for instance in Japanese Patent Application Publication No. Hei 8 (1996)-130317 (Pages 3 to 6, FIGS. 2 and 4).

As mentioned above, according to the conventional semiconductor device, the Zener diode and the Schottky barrier diode are connected in parallel in one device. This structure makes it possible to achieve a low voltage drive by use of a forward voltage (Vf) characteristic of the Schottky barrier diode. However, in the Schottky barrier diode, an epitaxial layer is used as a channel for a main current. This causes a problem in which a parasitic resistance is high in the epitaxial layer, thereby making it impossible to reduce an ON-resistance value.

Moreover, according to the conventional semiconductor device, in the Zener diode, the P-type guard region is formed at a lower portion of an end portion of an anode electrode formed on a top surface of the epitaxial layer. Likewise, in the Schottky barrier diode, the P-type guard region is formed at a lower portion of an end portion of the Schottky barrier metal layer. This structure protects a region where the electric field concentration is apt to occur using the P-type guard region. However, in a structure in which the P-type guard region is formed on an outermost periphery, when a reverse bias is applied, the curvature of the depletion layer is likely to be changed in the vicinity of the end portion of the anode electrode and that of the Schottky barrier metal layer. Particularly, when the above end portion is placed in the vicinity of a termination region of the depletion layer, the change in the curvature of the depletion layer is increased. As a result, there is a problem in which the electric field concentration is apt to occur in the region where the curvature of the depletion layer is changed, thereby making it difficult to achieve a desired withstand voltage characteristic.

Furthermore, according to the conventional semiconductor device, at a Zener diode operating time, free carriers (holes) which are minority carriers are excessively stored in the N-type epitaxial layer. Then, when the Zener diode is turned off, it is necessary to remove the stored free carriers (holes) from the P-type diffusion layer. At this time, a concentration of the free carriers (holes) in the vicinity of the P-type diffusion layer is high, thereby leading to an increase in an absolute value of a rate of a change of a reverse recovery current in time (di/dt). Accordingly, there is a problem in which a destruction of a protection diode is caused by the rate of change of the reverse recovery current in time (di/dt).

Still moreover, according to the conventional semiconductor device, the Zener diode and the Schottky barrier diode are connected in parallel to achieve the low voltage drive. However, when the above diode is used as a protection diode for a circuit element that forms a high frequency circuit, there is a problem in which a parasitic capacitance of the Zener diode is increased to cause deterioration in a high frequency characteristic.

SUMMARY OF THE INVENTION

The present invention provides a semiconductor device that includes first and second anode diffusion layers of opposite conductivity types formed on a semiconductor layer of one conductivity type to be isolated therefrom, a cathode diffusion layer of one conductivity type formed on the semiconductor layer, a third anode diffusion layer of an opposite conductivity type formed on the semiconductor layer to be connected to the second anode diffusion layer and extended to the cathode diffusion layer, an insulation layer formed on a top surface of the semiconductor layer, and an anode electrode connected to the first and second anode diffusion layers through a contact hole formed on the insulation layer, and forms a Schottky junction with the semiconductor layer between the first anode diffusion layer and the second anode diffusion layer, wherein at least one of the anode electrode and a metal layer connected to the anode electrode is formed on a top surface of the insulation layer placed at an upper portion of the third anode diffusion layer. Accordingly, in the present invention, since a protection diode is turned on at a forward voltage (Vf) lower than a circuit element, the circuit element can be protected from an overvoltage. Also, in the anode region, the third anode diffusion layer is placed toward the cathode diffusion layer more than the second anode diffusion layer. This structure prevents deterioration in a withstand voltage due to an end portion of the anode electrode, accordingly the protection diode can maintain a desired withstand voltage characteristic.

Furthermore, in the semiconductor device of the present invention, an end portion of the anode electrode is formed at an upper portion of the second anode diffusion layer of the semiconductor layer. Accordingly, in the present invention, it is possible to reduce a change in a curvature of a depletion layer at a lower portion of the end portion of the anode electrode and to prevent an electric field concentration and deterioration in a withstand voltage characteristic of the protection diode.

Moreover, in the semiconductor device of the present invention, the second anode diffusion layer is formed of at least two diffusion layers of opposite conductive types each having a different impurity concentration. Accordingly, in the present invention, a diffusion layer having a high impurity concentration can be formed in the vicinity of the end portion of the anode electrode. This structure suppresses an expansion of a depletion layer in an area where the electric field concentration is apt to occur, thereby making it possible to prevent deterioration in a withstand voltage characteristic of the protection diode.

Furthermore, in the semiconductor device of the present invention, an impurity concentration of the third anode diffusion layer is lower than that of the diffusion layers of the opposite conductivity type that forms the second anode diffusion layer. Accordingly, in the present invention, when a reverse bias is applied to the protection diode, a termination region of the deletion layer is isolated from the second anode diffusion layer. This structure reduces a change in a curvature of the depletion layer in the termination region thereof, thereby making it possible to prevent the deterioration in the withstand voltage characteristic of the protection diode.

Moreover, in the semiconductor device of the present invention, a discharge diffusion layer of an opposite conductivity type is formed and is overlapped on the cathode diffusion layer, and a cathode electrode is connected to the discharge diffusion layer of an opposite conductivity type. Accordingly, in the present invention, free carriers (holes) in the semiconductor layer can be removed through the cathode diffusion layer by recombination at a protection diode operating time. Also, it is possible to discharge the free carriers (holes) in the semiconductor layer through the discharge diffusion layer of the opposite conductivity type to which a cathode potential is applied. This structure reduces an absolute value of a rate of a change of a reverse recovery current in time (di/dt), thereby making it possible to prevent a destruction of the protection diode.

Furthermore, in the semiconductor device of the present invention, at least one of the anode electrode and the metal layer connected to the anode electrode is extended toward the cathode electrode more than the third anode diffusion layer. Accordingly, in the present invention, at least one of the anode electrode and the metal layer connected to the anode electrode is used as a filed plate. This structure makes it possible to improve a withstand voltage characteristic of the protection diode by use of a field plate effect.

Moreover, in the semiconductor device of the present invention, a contact hole for a wiring layer with which an anode potential is applied to the anode electrode is formed on an upper portion of the anode electrode. Accordingly, in the present invention, it is possible to prevent wiring from being routed to the anode electrode and reduce a wiring pattern area.

Furthermore, in the semiconductor device of the present invention, an electric field shielding film having an electric potential equal to that of the cathode diffusion layer is placed on the semiconductor layer placed at a lower portion of the wiring layer to which the anode potential is applied, and the electric field shielding film is placed in a region where the wiring layer traverses over the cathode diffusion layer. Accordingly, in the present invention, the electric field shielding film has a shielding effect to the wiring layer which is applied with the anode potential, and then an electric potential of a cathode region is reversed, thereby making it possible to prevent the anode region and an isolation region from being short-circuited.

DETAILED DESCRIPTION OF THE PREFERRED EMBODIMENT

Figure 1A:
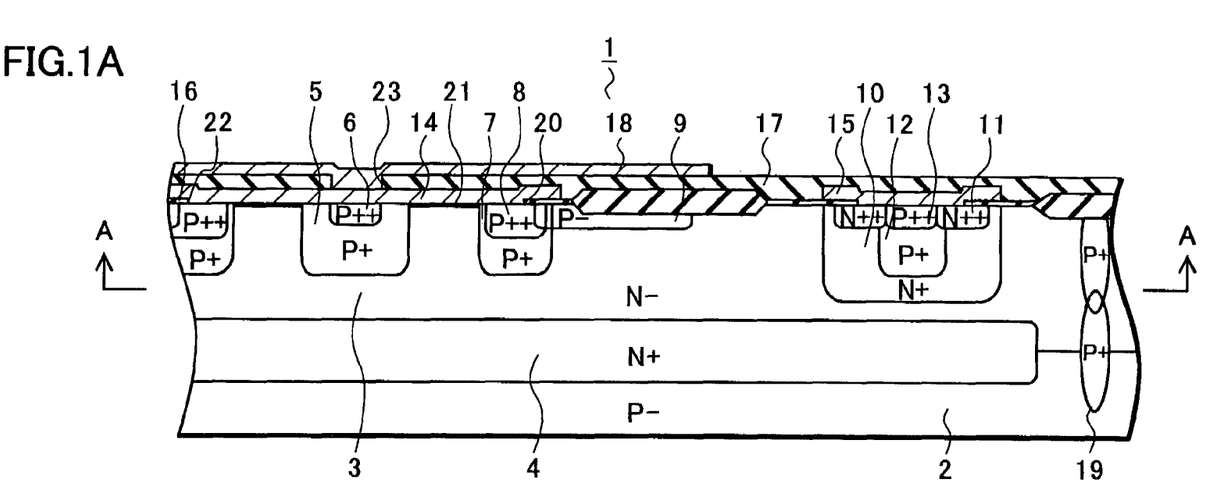
FIG. 1A and FIG. 1B are cross-sectional views each explaining a protection diode according to an embodiment of the present invention.
Figure 1B:
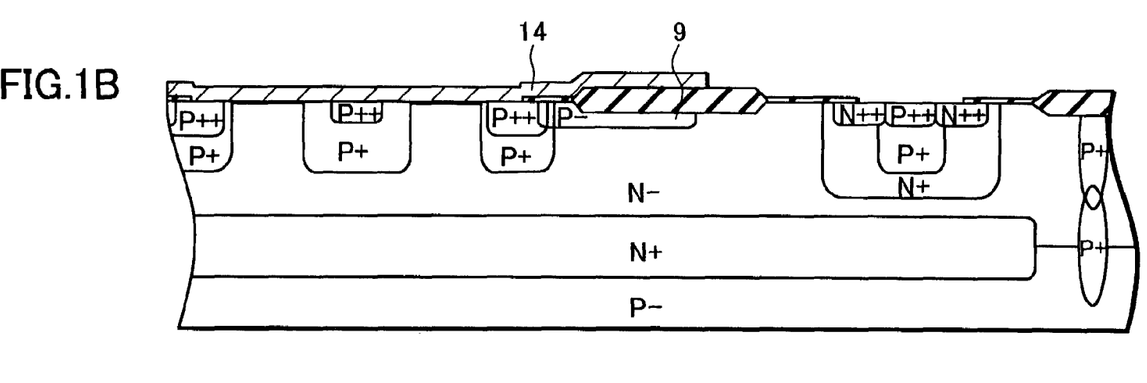
Figure 2A:
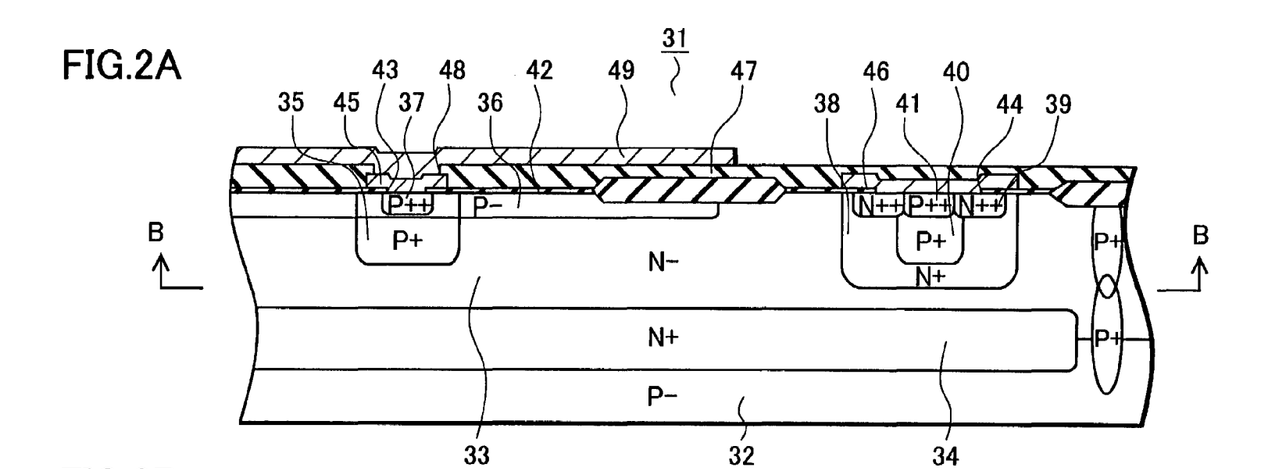
FIG. 2A and FIG. 2B are cross-sectional views each explaining a Zener diode according to the embodiment of the present invention.
Figure 2B:
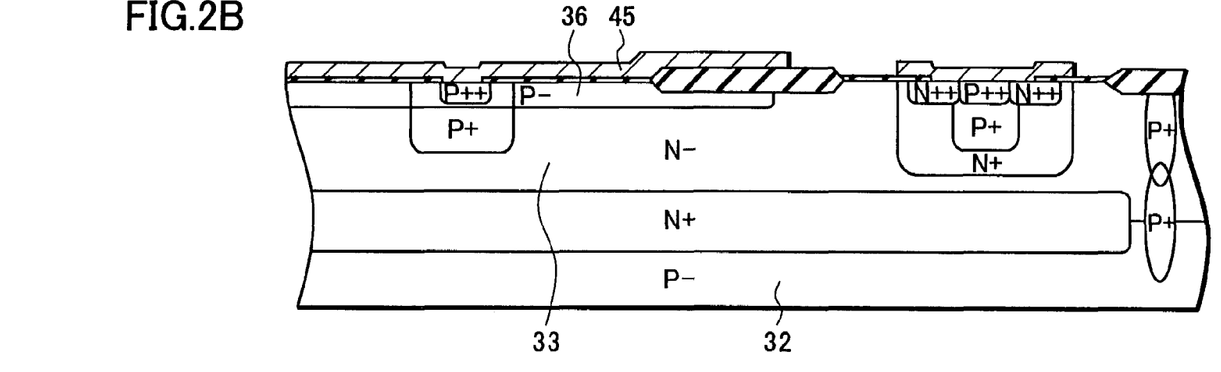
Figure 3:
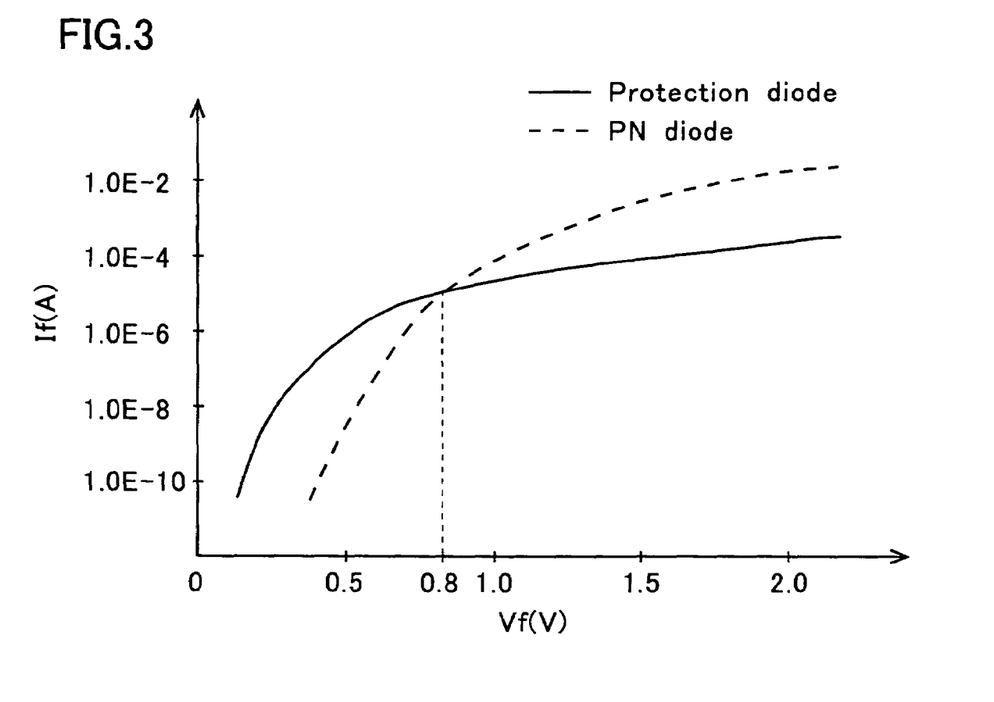
FIG. 3 is a view explaining a forward voltage (Vf) of each of the protection diode and a Zener diode according to the embodiment of the present invention.
Figure 4:
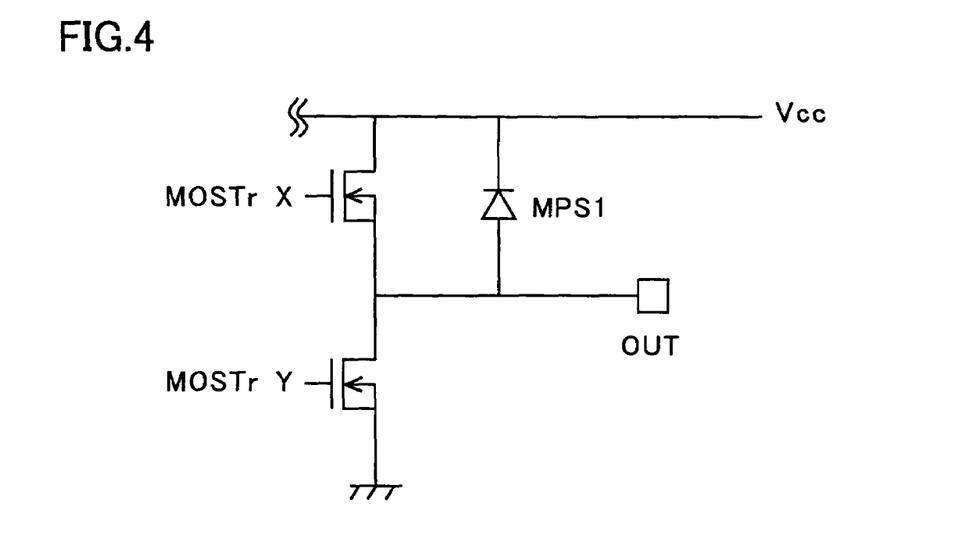
FIG. 4 is a view explaining a circuit into which the protection diode is incorporated according to the embodiment of the present invention.
Figure 5A:
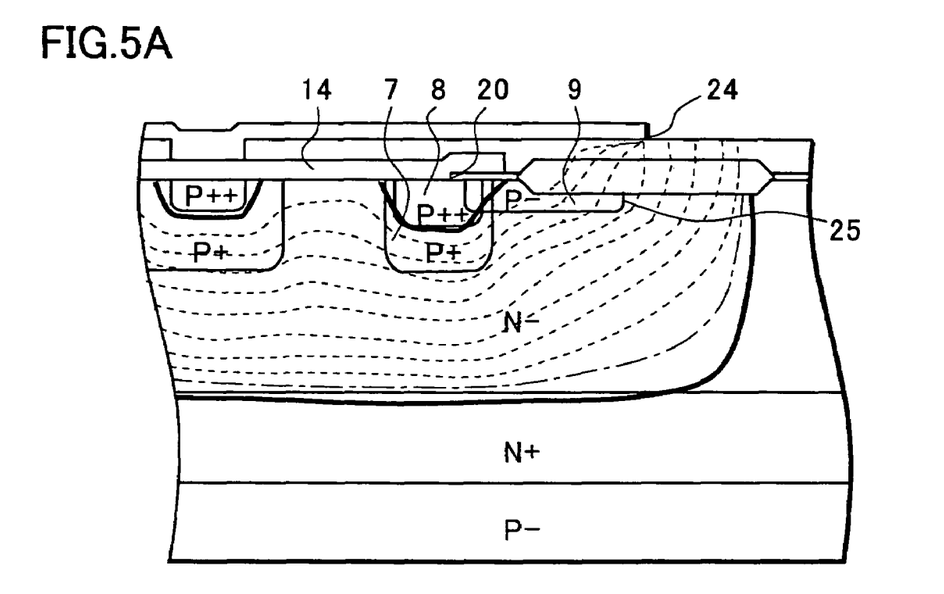
FIG. 5A is a view explaining an electric potential distribution of the protection diode in a reverse bias state according to the embodiment of the present invention, and 5B is a view explaining an impact ionization occurring region in the protection diode according to the embodiment of the present invention.
Figure 5B:
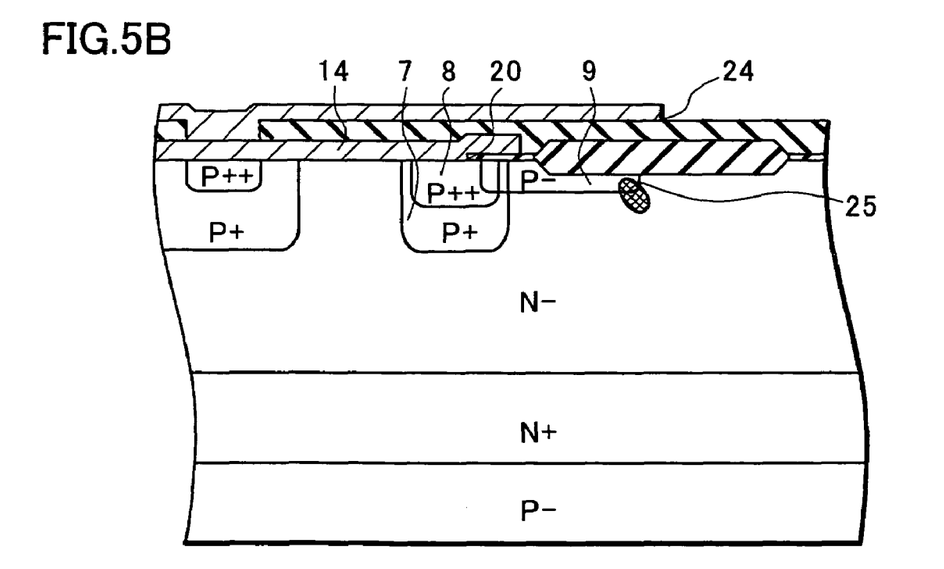
Figure 6:
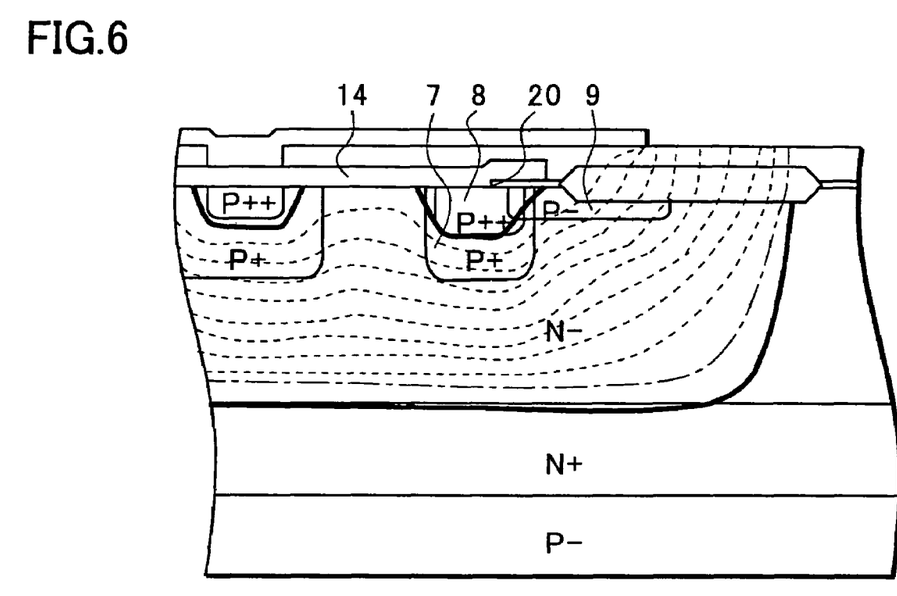
FIG. 6 is a view explaining an electric potential distribution of the protection diode in a reverse bias state according to the embodiment of the present invention.
Figure 7:
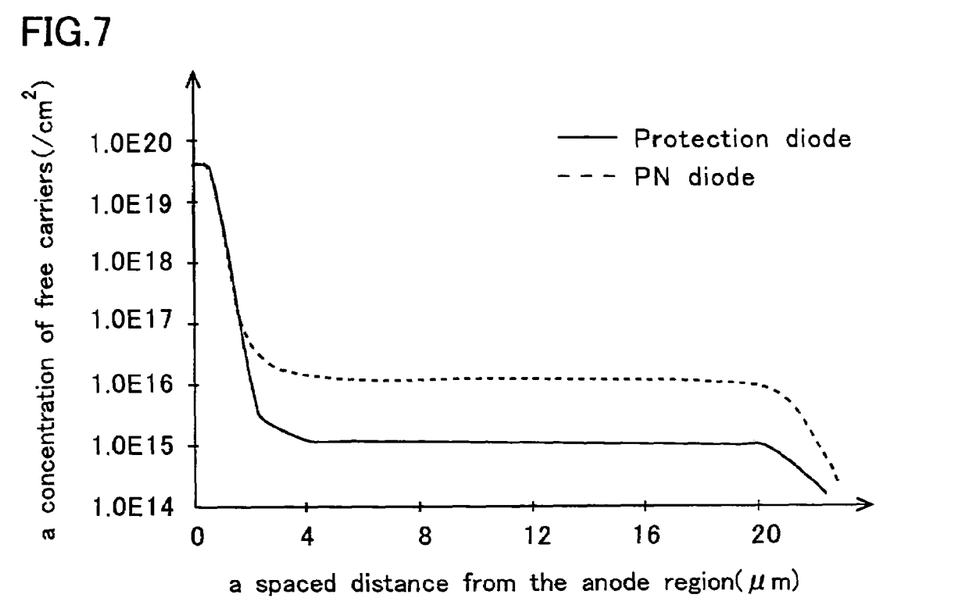
FIG. 7 is a view explaining a concentration profile of free carriers (holes) of each of the protection diode and the Zener diode according to the embodiment of the present invention.
Figure 8:
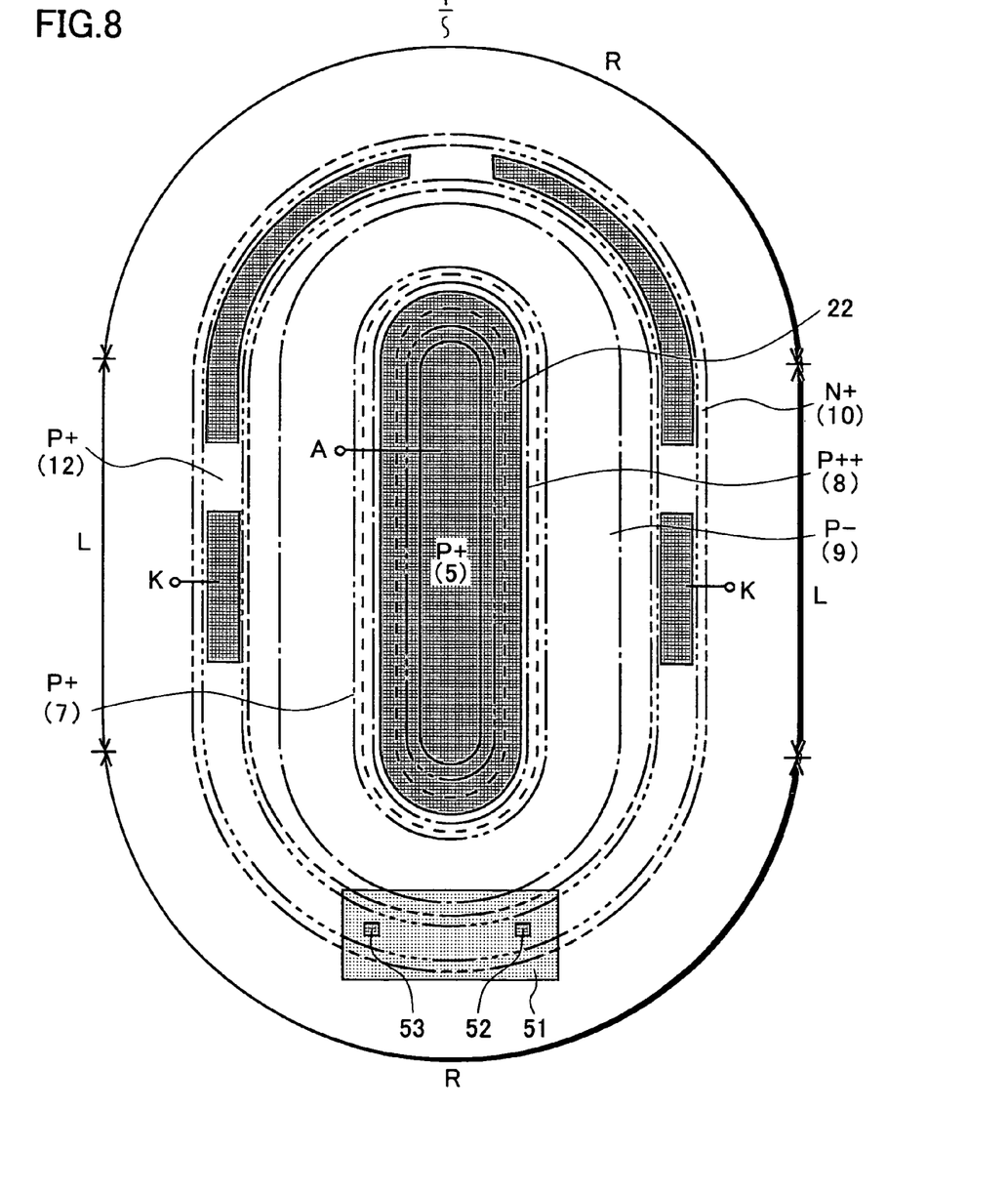
FIG. 8 is a plane view explaining the protection diode according to the embodiment of the present invention.

The following will specifically explain a semiconductor device according to one embodiment of the present invention with reference to FIGS. 1 to 7. FIG. 1A and FIG. 1B are cross-sectional views each explaining a protection diode according to one embodiment of the present invention. FIG. 2A and FIG. 2B are cross-sectional views each explaining a Zener diode according to the embodiment. FIG. 3 is a view explaining a forward voltage (Vf) of each of the protection diode and a Zener diode according to the embodiment. FIG. 4 is a view explaining a circuit into which the protection diode is incorporated according to the embodiment. FIG. 5A is a view explaining an electric potential distribution of the protection diode in a reverse bias state according to the embodiment. FIG. 5B is a view explaining an impact ionization occurring region in the protection diode according to the embodiment. FIG. 6 is a view explaining an electric potential distribution of the protection diode in a reverse bias state according to the embodiment. FIG. 7 is a view explaining a concentration profile of free carriers (holes) of each of the protection diode and the Zener diode according to the embodiment. FIG. 8 is a plane view explaining the protection diode according to the embodiment.

As illustrated in FIG. 1A, a protection diode 1 in which a Zener diode and a Schottky barrier diode are arranged in parallel mainly includes a P-type monocrystalline silicon substrate 2, an N-type epitaxial layer 3, an N-type buried diffusion layer 4, P-type diffusion layers 5, 6, 7, 8, and 9 which are used as an anode region, N-type diffusion layers 10 and 11 which are used as a cathode region, P-type diffusion layers 12, and 13, a Schottky barrier metal layer 14 which is used as an anode electrode, a metal layer 15 which is used as a cathode electrode, insulation layers 16 and 17, and a metal layer 18 connected to the anode electrode.

The N-type epitaxial layer 3 is deposited on a top surface of the P-type monocrystalline silicon substrate 2. It is noted that the epitaxial layer 3 of the present embodiment corresponds to "a semiconductor layer" of the present invention. Then, although the present embodiment shows a case in which one epitaxial layer 3 is formed on the substrate 2, the embodiment of the present invention is not limited to this case. For example, as "the semiconductor layer" of the present invention, a plurality of epitaxial layers may be formed on the top surface of the substrate. Moreover, only the substrate may be used as "the semiconductor layer" of the present invention, and the substrate may include an N-type monocrystalline silicon substrate and a compound semiconductor substrate.

The N-type buried diffusion layer 4 is formed in both regions of the substrate 2 and the epitaxial layer 3. As illustrated in FIG. 1, the N-type buried diffusion layer 4 is formed across a forming region of the protection diode 1 divided by an isolation region 19.

The P-type diffusion layers 5 and 6 are formed in the epitaxial layer 3. The P-type diffusion layer 5 is formed on diffusion conditions that, for example, an impurity concentration of a surface thereof is about 1.0E 16 to 17 (/cm$^2$) and a diffusion depth is about 5 to 6 (μm). The P-type diffusion layer 6 is formed on diffusion conditions that, for example, an impurity concentration of a surface thereof is about 1.0E 19 to 20 (/cm$^2$) and a diffusion depth is about 1 to 3 (μm). Then, the P-type diffusion layer 5 and the N-type epitaxial layer 3 form a PN junction and the P-type diffusion layers 5 and 6 are used as anode regions of the Zener diode. It is noted that the P-type diffusion layers 5 and 6 of the present embodiment correspond to "first anode diffusion layers of opposite conductivity type" of the present invention. However, only the P-type diffusion layer 5 or P-type diffusion layer 6 may be used as "the first anode diffusion layer of an opposite conductivity type" of the present invention. Furthermore, a triple diffusion structure may be used in which a P-type diffusion layer, having, for example, its surface impurity concentration of about 1.0E 17 to 18 (/cm$^2$) and a diffusion depth of about 2 to 4 (μm), is formed in the P-type diffusion layers 5 and 6.

The P-type diffusion layers 7 and 8 are formed in the epitaxial layer 3 and surround the P-type diffusion layer 5 annularly. The P-type diffusion layer 7 is formed on diffusion conditions that, for example, its surface impurity concentration is about 1.0E 16 to 17 (/cm$^2$) and a diffusion depth is about 5 to 6 (μm). The P-type diffusion layer 8 is formed on diffusion conditions that, for example, its surface impurity concentration is about 1.0E 17 to 18 (/cm$^2$) and a diffusion depth is about 2 to 4 (μm). Then, the P-type diffusion layer 7 and the N-type epitaxial layer 3 form a PN junction and the P-type diffusion layers 7 and 8 are used as the anode region of a Zener diode. Also, the P-type diffusion layers 7 and 8 are formed below an end portion 20 of the Schottky barrier metal layer 14 which serves as an anode electrode. The P-type diffusion layer 8, which has a higher impurity concentration than that of the P-type diffusion layer 7, is formed to be overlapped thereon. It is noted that the P-type diffusion layer 7 and 8 of the present embodiment correspond to "a second anode diffusion layer of an opposite conductivity type" of the present invention. However, at least one of the P-type diffusion layer 7 and the P-type diffusion layer 8 may be used as "the second anode diffusion layer of an opposite conductivity type" of the present invention. Also, a multi-diffusion structure such as the triple diffusion structure and the like may be used.

The P-type diffusion layer 9 is formed to surround the P-type diffusion layer 5 annularly, and a part of the forming regions thereof is overlapped on the P-type diffusion layers 7 and 8. The P-type diffusion layer 9 is formed on diffusion conditions that, for example, its surface impurity concentration is about 1.0E 15 to 16 (/cm$^2$) and a diffusion depth is about 1 to 3 (μm). Then, the P-type diffusion layer 9 is formed and is extended toward the N-type diffusion layer 10 more than the P-type diffusion layers 7 and 8. Then, the impurity concentration of the P-type diffusion layer 9 is lower than that of each of the P-type diffusion layers 7 and 8. It is noted that the P-type diffusion layer 9 of the present embodiment corresponds to "a third anode diffusion layer of an opposite conductivity type" of the present invention.

Also, in the epitaxial layer 3, the N-type diffusion layers 10 and 11 are formed to surround the P-type diffusion layer 5 annularly. The N-type diffusion layers 10 and 11 and the N-type epitaxial layer 3 are used as the cathode region of the Zener diode and the Schottky barrier diode. Then, a wide diffusion region is formed as the N-type diffusion layer 10, thereby reducing a parasitic capacitance value. On the other hand, although the N-type diffusion layer 11 is a narrow diffusion layer, the N-type diffusion layer 11 has a high impurity concentration, thereby improving a reduction in resistance. It is noted that the N-type diffusion layers 10 and 11 of the present embodiment correspond to "a cathode diffusion layer of one conductivity type" of the present invention. However, at least one of the N-type diffusion layer 10 and N-type diffusion layer 11 may be used as "the cathode diffusion layer of one conductivity type" of the present invention. Also, the multi-diffusion structure such as the triple diffusion structure and the like may be used.

The P-type diffusion layers 12 and 13 are formed in the N-type diffusion layer 10, and their forming regions are overlapped on each other. The P-type diffusion layers 12 and 13 are formed to surround the P-type diffusion layer 5 annularly. The P-type diffusion layer 12 is formed on diffusion conditions that, for example, its surface impurity concentration is about 1.0E 16 to 17 (/cm$^2$) and a diffusion depth is about 5 to 6 (μm). The P-type diffusion layer 13 is formed on diffusion conditions that, for example, its surface impurity concentration is about 1.0E 19 to 20 (/cm$^2$) and a diffusion depth is about 1 to 3 (μm). Then, the metal layer 15, which is used as a cathode electrode, is in contact with the N-type diffusion layer 11 and the P-type diffusion layer 13. With this structure, the P-type diffusion layers 12 and 13 are formed to have electric potentials equal to that of the N-type diffusion layers 10 and 11. It is noted that the P-type diffusion layers 12 and 13 of the present embodiment correspond to "a discharge diffusion layer of opposite conductivity type" of the present invention. However, at least one of the P-type diffusion layer 12 and P-type diffusion layer 13 may be used as "the discharge diffusion layer of opposite conductivity type" of the present invention. Also, the multi-diffusion structure such as the triple diffusion structure and the like may be used.

The Schottky barrier metal layer 14 is formed on the top surface of the epitaxial layer 3. The Schottky barrier metal layer 14 is formed, for example, by depositing a titanium nitride (TiN) layer on a titanium (Ti) layer. As shown by a thick line, a silicide layer 21 of a titanium silicide (TiSi$_2$) is formed on the surface of the epitaxial layer 3 positioned between the P-type diffusion layer 5 and the P-type diffusion layer 9. Then, a Schottky barrier diode is formed of the silicide layer 21 of the Schottky barrier metal layer 14, and the epitaxial layer 3. It is noted that metals such as tungsten (W), molybdenum (Mo), tantalum (Ta), cobalt (Co), nickel (Ni), and platinum (Pt) may be used in place of the titanium (Ti) layer. In this case, a tungsten silicide (WSi$_2$) layer, a molybdenum silicide (MoSi$_2$) layer, a cobalt silicide (CoSi$_2$) layer, a nickel silicide (NiSi$_2$) layer, a platinum silicide (PtSi$_2$) layer are formed as a silicide layer 21.

The metal layer 15 is formed on the top surface of the epitaxial layer 3. The metal layer 15 has a structure in which an aluminum silicon (AlSi) layer, an aluminum copper (AlCu) layer or an aluminum silicon copper (AlSiCu) layer is layered on the barrier metal layer. Then, the metal layer 15 is used as a cathode electrode and a cathode potential is applied to the N-type diffusion layer 8 and the P-type diffusion layer 13.

The insulation layers 16 and 17 are formed on the upper portion of the epitaxial layer 3. The insulation layers 16 and 17 are formed by selectively layering, for example, a silicon oxide film, a silicon nitride film, a TEOS (Tetra-Ethyl-Orso-Silicate) film, a BPSG (Boron Phospho Silicate Glass) film, an SOG (Spin On Glass) film, and the like. A contact hole 22 is formed on the insulation film 16. The contact hole 22 is filled with the Schottky barrier metal layer 14 and the Schottky barrier metal layer 14 is used as an anode electrode. It is noted that the insulation layers 16 and 17 of the present embodiment correspond to "an insulation layer" of the present invention. However, any film may be used as "the insulation layer" of the present invention if the film is formed by layering the silicon oxide film and the like selectively.

The metal layer 18 is formed on a top surface of the insulation layer 17, and covers a region above the forming region of the P-type diffusion layer 9. The metal layer 18 has a structure in which an aluminum silicon (AlSi) layer, an aluminum copper (AlCu) layer or an aluminum silicon copper (AlSiCu) layer is layered on the barrier metal layer. The metal layer 18 fills a contact hole 23 which is formed in the insulation layer 17, and is connected to the Schottky barrier metal layer 14. With this structure, when the reverse bias is applied to the protection diode 1, the metal layer 18 is used as a field plate, thereby improving a withstand voltage characteristic of the protection diode 1.

Additionally, in the present embodiment, as illustrated in FIG. 1B, the Schottky barrier metal layer 14 may be formed and covers a region above the forming region of the P-type diffusion layer 9 as in the metal layer 18 illustrated in FIG. 1A. In this case, when the reverse bias is applied to the protection diode 1, the Schottky barrier metal layer 14 is used as a field plate, thereby improving the withstand voltage characteristic of the protection diode 1.

FIG. 2A illustrates a Zener diode 31. It is noted that the Zener diode has substantially the same withstand voltage characteristic as that of the protection diode 1 shown in FIG. 1. The following will explain the structure.

An N-type epitaxial layer 33 is deposited on a top surface of a P-type monocrystalline silicon substrate 32. An N-type buried diffusion layer 34 is formed in both regions of the substrate 32 and the epitaxial layer 33. P-type diffusion layers 35, 36, and 37 are formed in the epitaxial layer 33. The P-type diffusion layers 35, 36 and the N-type epitaxial layer 33 form a PN junction region and the P-type diffusion layers 35, 36 and 37 are used as an anode region of the Zener diode.

N-type diffusion layers 38 and 39 are formed in the epitaxial layer 33. The N-type diffusion layers 38 and 39 and the N-type epitaxial layer 33 are used as cathode regions of the Zener diode. Then, P-type diffusion layers 40 and 41 are formed in the N-type diffusion layer 38.

An insulation layer 42 is formed on a top surface of the epitaxial layer 33 and contact holes 43 and 44 are formed in the insulation layer 42. A metal layer 45 is connected to the P-type diffusion layer 37 through the contact hole 43 and is used as an anode electrode. A metal layer 46 is connected to the N-type diffusion layer 39 and the P-type diffusion layer 41 through the contact hole 44 and is used as a cathode electrode.

An insulation layer 47 is formed on the insulation layer 42 and a contact hole 48 is formed in the insulation film 47. A metal layer 49 is connected to the metal layer 45 through the contact hole 48. Also, the metal layer 49 is formed to cover a region above a forming region of the P-type diffusion layer 36 and provides a field plate effect.

Additionally, in the present embodiment, as illustrated FIG. 2B, the metal layer 45 may be formed to cover a region above the forming region of the P-type diffusion layer 36 as in the metal layer 49 shown in FIG. 2A.

Next, in FIG. 3, a forward voltage (Vf) of the protection diode 1 is shown by a solid line and a forward voltage (Vf) of the PN diode 31 by a doted line.

As described using FIG. 1, in the protection diode 1, the PN diode and the Schottky barrier diode are arranged in parallel. It is shown from this structure that the forward current (If) of the protection diode 1 is higher than that of the PN diode 31 and has an excellent current capability when Vf is, for example, 0.8 (V) or less. On the other hand, it is shown that the protection diode 1 is driven at a lower electric potential than that of the Zener diode 31, when If is, for example, 1.0E-8 (A). Namely, by this device characteristic, a MOS transistor connected to an output terminal, and the protection diode 1 are connected in parallel, thereby making it possible to protect the MOS transistor from an overvoltage generated at an electric discharge in a cathode ray tube or at a turn-off of L load such as a motor load.

More specifically, FIG. 4 shows a circuit in which N-channel type MOS transistors X and Y are connected in series between a power supply line (Vcc) and a ground (GND), and a source electrode of the MOS transistor X and a drain electrode of the MOS transistor Y are connected to an output terminal.

The following will explain a case in which an overvoltage is applied to an output terminal of a circuit where the protection diode 1 is not connected between the power supply line (Vcc) and the output terminal. A forward bias is applied by the overvoltage between the source and drain of the MOS transistor X where the reverse bias is applied. At this time, a current more than an allowed value flows between the source and the drain, accordingly, the PN junction region is destroyed and the MOS transistor X is destroyed.

However, in the present embodiment, the protection diode 1 and the MOS transistor X are connected in parallel between the power supply line (Vcc) and the output terminal. In this case, as explained using FIG. 3, when the overvoltage is applied to the output terminal, the protection diode 1 is first operated and almost all current generated by the overvoltage can be let out to the power supply line (Vcc) by the protection diode 1. This results that the current flowing between the source and the drain of the MOS transistor X is reduced, accordingly, it is possible to prevent the PN junction region from being destroyed.

Next, in FIG. 5A, a thick solid line shows an end region of the depletion layer, a dotted line shows an equipotential line, and a dashed-dotted line shows an equipotential line of 318 (V). The P-type diffusion layers 7 and 8 are formed at the lower portion of the end portion 20 of the Schottky barrier metal layer 14 in a double diffusion structure. Then, a region where the P-type diffusion layers 7 and 8 are overlapped on each other is a high impurity concentration region, and the region includes a part which is not depleted as illustrated by a solid line. As a result, the distance between the equipotential lines is not reduced at the lower portion of the Schottky barrier metal layer 14, accordingly, an electric field concentration is hard to occur. In other words, the electric field concentration on the end portion 20 of the Schottky barrier metal layer 14 is relaxed, thereby making it possible to improve the withstand voltage characteristic of the protection diode 1.

Moreover, the P-type diffusion layer 9 is connected to the P-type diffusion layers 7 and 8, and the P-type diffusion layer 7 is extended to the cathode electrode. The P-type diffusion layer 9 has the low impurity concentration and is filled with the depletion layer as illustrated in FIG. 5A. Then, in the region where the P-type diffusion layer 9 is formed, the distance between the equipotential lines is gradually changed. In other words, the P-type diffusion layer 9, which is filed with the depletion layer, is formed on an outermost periphery from the anode electrode. This structure reduces the change in the curvature of the depletion layer in the termination region thereof, and improves the withstand voltage characteristic of the protection diode 1 as illustrated in FIG. 5A. As a result, it is possible to improve a problem on the deterioration of the withstand voltage characteristic by forming the Schottky barrier diode, therefore the Schottky barrier diode can be driven at a low forward voltage (Vf).

Furthermore, the metal layer 18 is extended toward the cathode electrode more than the P-type diffusion layer 9. As illustrated in FIG. 5A, with the field plate effect by the metal layer 18 to which the anode potential is applied, some equipotential lines are displaced to converge onto an end portion 24 of the metal layer 18. As a result, the equipotential lines concentrate on the lower portion of the end portion 24 of the metal layer 18, and the electric field concentration is apt to occur. As illustrated in FIG. 5B, the impact ionization occurs in the vicinity of an end portion 25 of the P-type diffusion layer 9 placed at the cathode electrode. It is shown in FIG. 5A that the formation of the P-type diffusion layers 7 and 8 prevents the deterioration of the withstand voltage characteristic at the end portion 20 of the Schottky barrier metal layer 14 where the electric field concentration is apt to occur.

FIG. 6 illustrates an electric potential distribution when the position of the end portion 24 of the metal layer 18 is changed to the upper surface of the P-type diffusion layer 9 from the reverse bias state of FIG. 5A. A thick solid line shows the end region of the depletion layer, a dotted line shows the equipotential line, and a dashed-dotted line shows the equipotential line of 279 (V). As illustrated in FIG. 6, with the field plate effect by the metal layer 18 to which the anode potential is applied, some equipotential lines are displaced to converge onto the end portion 24 of the metal layer 18. In this case, the end portion 24 of the metal layer 18 is positioned in the anode electrode, thereby suppressing the expansion of the depletion layer. As a result, it is shown that the withstand voltage characteristic of the protection diode is degraded as compared with the case of FIG. 5A.

It is noted that the present embodiment has explained the case in which the metal layer 18, serving as the field plate, is extended toward the cathode electrode more than the P-type diffusion layer 9. However, the embodiment of the present invention is not limited to this case. Regarding the relationship in a position between the end portion 24 of the metal layer 18 and the end portion 25 of the P-type diffusion layer 9, design changes may be arbitrarily made depending on an impurity concentration and a diffusion depth of the P-type diffusion layer 9, and a thickness of the insulation film placed at the lower portion of the metal layer 18. For example, there is a case in which the impurity concentration of the P-type diffusion layer 9 is higher than that of the present embodiment under the same condition of the diffusion depth of the P-type diffusion layer 9 and the thickness of the insulation film placed at the lower portion of the metal layer 18. In this case, the end portion 24 of the metal layer 18 is structured to be extended toward the cathode electrode more than the end portion 25 of the P-type diffusion layer 9. This structure intensifies an influence of the electric field originating from the metal layer 18, and makes it possible to improve the withstand voltage characteristic of the protection diode 1. On the other hand, there is a case in which the impurity concentration of the P-type diffusion layer 9 is lower than that of the present embodiment. In this case, the end portion 25 of the P-type diffusion layer 9 is structured to be extended toward the cathode electrode more than the end portion 24 of the metal layer 18. This structure intensifies the influence of the electric field originating from the metal layer 18, and makes it possible to improve the withstand voltage characteristic of the protection diode 1.

Next, in FIG. 7, a solid line shows a concentration profile of free carriers (holes) of the protection diode 1 at a cross section taken along a line A-A (FIG. 1A) and a dotted line shows a concentration profile of free carriers (holes) of the Zener diode 31 at a cross section taken along a line B-B (FIG. 2A). It is noted that a longitudinal axis shows a concentration of free carriers (holes) in the epitaxial layer, and a horizontal axis shows a spaced distance from the anode region. Then, FIG. 7 shows the concentration profiles in a state that Vf=0.8 (V) is applied to the protection diode 1 and the Zener diode 31, respectively.

First, as illustrated in FIG. 1, at the time of operating the protection diode 1, the forward voltage (Vf) is applied to the PN junction region of the P-type diffusion layer 5 and the N-type epitaxial layer 3, and the free carriers (holes) are implanted into the epitaxial layer 3 from the P-type diffusion layer 5. On the other hand, as illustrated in FIG. 2, at the time of operating the Zener diode 31, the forward voltage (Vf) is applied to the PN junction region of the P-type diffusion layer 34 and the N-type epitaxial layer 33, and the free carriers (holes) are implanted into the epitaxial layer 33 from the P-type diffusion layer 34. Namely, both the protection diode 1 and the Zener diode 31 have substantially equal concentration of the free carriers (holes) in the region close to the P-type diffusion layers 5 and 34.

Next, as illustrated in FIG. 1, in the protection diode 1, the Schottky barrier diode is formed, therefore the P-type diffusion layers 7, 8, and 9 are formed to be isolated from the P-type diffusion layer 5. This structure reduces the PN junction region to which the forward voltage (Vf) is applied and decreases the free carriers (holes) to be implanted into the N-type epitaxial layer 3. As a result, in the protection diode 1, the concentration of free carriers (holes) is reduced in the region isolated from the P-type diffusion layer 5 as compared with that of the Zener diode 31. Additionally, in the epitaxial layer 3, the free carriers (holes) are distributed and cause a conductivity modulation, accordingly, the main current flows with a low ON resistance. This can solve the problem of the Schottky barrier diode in which the ON-resistance value is high.

Finally, as illustrated in FIG. 1, the cathode region of the protection diode 1 is formed and has a double diffusion structure of the N-type diffusion layers 10 and 11. With this structure, the free carriers (holes) implanted from the P-type diffusion layer 5 are recombined with free carriers (electrons) implanted from the N-type diffusion layers 10 and 11 in a region close to the N-type diffusion layer 10. At this time, the N-type diffusion layer 10 is widely diffused, thereby making it possible to promote the recombination.

Furthermore, in the protection diode 1, the P-type diffusion layers 12 and 13 to which the cathode potential is applied are formed in the N-type diffusion layer 10. Then, the free carriers (holes) which reached the P-type diffusion layers 12 and 13 and are not recombined, are discharged from the P-type diffusion layers 12 and 13 to the outside of the epitaxial layer 3. As a result, the concentration of the free carriers (holes) in the region close to the cathode region can be largely reduced and the free carriers (holes) in the epitaxial layer 3 can be also reduced. On the other hand, as illustrated in FIG. 2, the cathode region of the Zener diode 31 also has the same structure and the concentration of the free carriers (holes) in the region close to the cathode region is largely reduced.

As mentioned above, in the protection diode 1, the Schottky barrier diode is formed and the cathode region where the free carriers (holes) are apt to be discharged from the epitaxial layer 3 is formed. This structure can reduce the concentration of the free carriers (holes) stored in the vicinity of the PN junction region of the protection diode 1. As a result, when the protection diode 1 is turned off, an absolute value of a rate of a change of a reverse recovery current in time (di/dt) is reduced, thereby making it possible to obtain a soft recovery characteristic. Moreover, it is possible to prevent the destruction of the protection diode 1 caused by the rate of the change of the reverse recovery current in time (di/dt).

Next, as illustrated in FIG. 8, the protection diode 1 is formed in, for example, an elliptical shape. In a linear region L of the elliptical shape, the P-type diffusion layer 5 (a region surrounded by a solid line), which is used as an anode region, is placed in a central region. Then, in the linear region L and a round region R of the elliptical shape, the P-type diffusion layers 7 (a region surrounded by a two-dot chain line) and 8 (a region surrounded by a dotted line) are formed in an annular shape to surround the P-type diffusion layer 5. As mentioned above, the P-type diffusion layers 7 and 8 relax the electric field concentration on the end portion 20 (FIG. 1) of the Schottky barrier metal layer 14 (FIG. 1), thereby improving the withstand voltage characteristic of the protection diode 1.

In the linear region L and the round region R of the elliptical shape, the P-type diffusion layer 9 (a region surrounded by a dashed-dotted line) is formed in an annular shape and surrounds the P-type diffusion layers 7 and 8.

Also, in the linear region L and the round region R of the elliptical shape, the N-type diffusion layer 10, serving as the cathode region, (a region surrounded by a three-dot chain line) is formed in an annular shape and surrounds the P-type diffusion layer 9. Then, in the region where the N-type diffusion layer 10 is formed, the P-type diffusion layer 12 (a region surrounded by a four-dot chain line) is formed in an annular shape and the forming region thereof is overlapped on the N-type diffusion layer 10. Additionally, although not illustrated, in the P-type diffusion region 5, the P-type diffusion layer 6 (FIG. 1) is formed and the forming region thereof is overlapped on the P-type diffusion layer 5. Also, in the N-type diffusion region 10, the N-type diffusion layer 11 (FIG. 1) and the P-type diffusion layer 13 (FIG. 1) are formed and the forming regions thereof are overlapped on the N-type diffusion layer 10.

With this structure, the protection diode 1 can cause a current to flow in the linear region L and the round region R of the elliptical shape, thereby improving the current capability. Further, in the round region R of the elliptical shape, the round shape and the P-type diffusion layers 7 and 8 relax the electric field concentration and make it possible to improve the withstand voltage characteristic of the protection diode 1. Furthermore, the elliptical shape of the protection diode 1 allows a device size to be reduced.

The contact hole 22 (FIG. 1) is formed and provided an opening from the P-type diffusion layer 5 to parts of the P-type diffusion layers 7 and 8. The Schottky barrier metal layer 14 is connected to the P-type diffusion layer 5, the N-type epitaxial layer 3 (FIG. 1) and the P-type diffusion layers 7 and 8 through the contact hole 22. As mentioned above, the Schottky barrier metal layer 14 is directly formed on the top surface of the epitaxial layer 3. Then, the Schottky barrier metal layer 14 is formed to keep flatness over the wide region in the contact hole 22. With this structure, the contact hole 23 is formed on the surface directly above the Schottky barrier metal layer 14, through which the metal layer 18 is connected to the Schottky barrier metal layer 14. In other words, the contact hole 23 is formed on the contact hole 22 (FIG. 1) which is for the Schottky barrier metal layer 14. As a result, it is possible to prevent wiring from being routed to the Schottky barrier metal layer 14, and to reduce a wiring pattern area. Additionally, in the explanation of FIG. 8, the same reference numerals as those of FIG. 1 are used for the same structural elements as those of FIG. 1, and the reference numerals are parenthesized in FIG. 8.

Finally, in the round region R of the elliptical shape, an electric field shielding film 51 is formed in a region which is placed at a lower portion of a wiring layer (not shown) applied with an anode potential, and in which the wiring layer at least applied with the anode potential and the N-type cathode diffusion layer 10 cross each other. The electric field shielding film 51 is formed in a process shared with a process for forming a gate electrode of a MOS transistor (not shown) and made of a polysilicon film, for example. Then, the electric field shielding film 51 is connected to the diffusion layers serving as the cathode region, through contact holes 52 and 53 formed in an insulation layer between the epitaxial layer 3 and the electric field shielding film 51. Namely, an electric potential substantially equal to that of the cathode potential is applied to the electric field shielding film 51. With this structure, the electric field shielding film 51 has a shield effect to the wiring layer to which the anode potential is applied. Then, an electric potential of the cathode region is reversed by an electric potential difference between the cathode potential and the anode potential, thereby making it possible to prevent the anode region and the isolation region 19 (FIG. 1) from being short-circuited.

It is noted that the present embodiment has explained the case in which the silicide layer 21 is formed between the P-type diffusion layer 5 serving as the anode region, and the P type diffusion layer 7 serving as the anode region. However, the embodiment of the present invention is not limited to this case. For example, in order to improve the forward voltage (Vf) characteristic of the Schottky barrier diode in the protection diode, there is a case in which the space between the P-type diffusion layer 5 and the P-type diffusion layer 7 is increased and the silicide layer 21 is formed over a wide region. In this case, new P-type diffusion layers to which the anode potential is applied may be formed between the P-type diffusion layer 5 and the P-type diffusion layer 7 at substantially constant intervals. This makes it possible to reduce the change in the curvature of the depletion layer in the forming region of the silicide layer 21 and to maintain the withstand voltage characteristic of the protection diode.

Also, the P-type diffusion layer 5 may be structured to be diffused deeper than the P-type diffusion layer 7. When the P-type diffusion layer 5 is diffused deeper than the P-type diffusion layer 7, a bottom surface of the P-type diffusion layer 5 is largely separated away from the surface of the epitaxial layer 3 in a vertical direction. Then, the depletion layer expanding from the boundary of the P-type diffusion layer 5 and the epitaxial layer 3 expands to a wide region in a horizontal direction. This results that the spaced distance between the P-type diffusion layer 5 and the P-type diffusion layer 7 can be increased, thereby making it possible to expand the forming region of the silicide layer 21. This allows an improvement of the current capability of the Schottky diode without increasing the P-type diffusion layer connected to the anode electrode. In addition, various modifications can be made without departing from the scope of the embodiment of the present invention.

In the embodiment of the present invention, on the semiconductor layer, there is formed the protection diode in which a Zener diode and a Schottky barrier diode are arranged in parallel. The protection diode uses a low forward voltage (Vf) characteristic of the Schottky barrier diode. Then, the protection diode is connected to a desired circuit element in parallel. This structure causes the protection diode to operate before the circuit element operates when the overvoltage is applied to the circuit element, thereby making it possible to prevent the circuit element from being destroyed.

Also, in the embodiment of the present invention, one P-type diffusion layer is formed below an end portion of a Schottky barrier metal layer. Then, the other P-type diffusion having a low impurity concentration is connected to one P-type diffusion layer and extended to the cathode diffusion layer. This structure reduces the change in the curvature of the depletion layer in the termination region thereof, thereby making it possible to prevent the deterioration in the withstand voltage of the protection diode when the reverse bias is applied to the protection diode.

Moreover, in the embodiment of the present invention, a high impurity concentration diffusion layer having a double diffusion structure is formed at the end portion of the anode electrode. This structure prevents the depletion layer from being expanded to a portion close to the end portion of the anode electrode, thereby making it possible to keep an electric field concentration from occurring in this region. Thus, the deterioration in the withstand voltage of the protection diode can be prevented.

Furthermore, in the embodiment of the present invention, a P-type diffusion layer to which a cathode potential is applied is formed in a cathode region. This structure makes it possible to reduce a concentration of free carriers (holes) in the semiconductor layer at a protection diode operating time. Then, this reduces an absolute value of a rate of a change of a reverse recovery current in time (di/dt), thereby making it possible to prevent the destruction of the protection diode. Also, in the embodiment of the present invention, on a top surface of the anode diffusion layer extended to the cathode electrode, at least one of the metal layer to which an anode potential is applied and the anode electrode is formed. According to this structure, when the reverse bias is applied to the protection diode, a field plate effect can be obtained, and the change in the curvature of the depletion layer is reduced, thereby making it possible to improve the withstand voltage characteristic.

What is claimed is:

1. A semiconductor device comprising:
   first and second anode diffusion layers of a first conductivity type formed in a semiconductor layer of a second conductivity type, wherein the first and second anode diffusion layers are isolated from each other;
   a cathode diffusion layer of the second conductivity type formed in the semiconductor layer;
   a third anode diffusion layer of the first conductivity type formed in the semiconductor layer, connected to the second anode diffusion layer, and extended to the cathode diffusion layer:
   an insulation layer formed on a top surface of the semiconductor layer; and
   an anode electrode connected to the first and second anode diffusion layers through a contact hole formed in the insulation layer, and forming a Schottky junction with the semiconductor layer between the first anode diffusion layer and the second anode diffusion layer,
   wherein the second anode diffusion layer is placed surrounding the first anode diffusion layer,
   an end portion of the anode electrode is formed at an upper portion of the second anode diffusion layer,
   the third anode diffusion layer is extended toward the cathode diffusion layer more than the second anode diffusion layer, and
   an impurity concentration of the third anode diffusion layer is lower than that of the second anode diffusion layer.

2. The semiconductor device according to claim 1, wherein the second anode diffusion layer is formed of at least two diffusion layers of the first conductive type each having different impurity concentrations.

3. The semiconductor device according to claim 1, wherein a discharge diffusion layer of the first conductivity type is formed to be overlapped on the cathode diffusion layer and a cathode electrode is connected to the discharge diffusion layer of the first conductivity type.

4. The semiconductor device according to claim 3, wherein the anode electrode is extended toward the cathode electrode more than the third anode diffusion layer.

5. The semiconductor device according to claim 1, wherein a contact hole for a wiring layer with which an anode potential is applied to the anode electrode is formed on an upper portion of the anode electrode.

6. The semiconductor device according to claim 1, wherein an electric field shielding film having an electric potential equal to that of the cathode diffusion layer is formed on the semiconductor layer at a lower portion of the wiring layer to which the anode potential is applied, and the electric field shielding film is formed in a region where the wiring layer traverses over the cathode diffusion layer.

7. The semiconductor device according to claim 3, wherein an electric field shielding film having an electric potential equal to that of the cathode diffusion layer is formed on the semiconductor layer at a lower portion of the wiring layer to which the anode potential is applied, and the electric field shielding film is formed in a region where the wiring layer traverses over the cathode diffusion layer.

* * * * *